(12) United States Patent
Taira (10) Patent No.: US 8,170,517 B2
(45) Date of Patent: May 1, 2012

(54) RECEIVING APPARATUS

(75) Inventor: Masaaki Taira, Akashi (JP)

(73) Assignees: Semiconductor Components Industries, LLC, Phoenix, AZ (US); Sanyo Semiconductor Co., Ltd., Gunma (JP)

( * ) Notice: Subject to any disclaimer, the term of this patent is extended or adjusted under 35 U.S.C. 154(b) by 355 days.

(21) Appl. No.: 12/500,383

(22) Filed: Jul. 9, 2009

(65) Prior Publication Data

US 2010/0009647 A1    Jan. 14, 2010

(30) Foreign Application Priority Data

Jul. 11, 2008    (JP) .................................. 2008-181902

(51) Int. Cl.
*H04B 1/06* (2006.01)
*H04B 7/00* (2006.01)

(52) U.S. Cl. .................. 455/255; 455/209; 455/315

(58) Field of Classification Search .................. 455/204, 455/207–209, 313–315, 255–257
See application file for complete search history.

(56) References Cited

U.S. PATENT DOCUMENTS

| | | | | |
|---|---|---|---|---|
| 2006/0281432 A1* | 12/2006 | Isaac et al. | ..................... | 455/323 |
| 2007/0030063 A1 | 2/2007 | Izumi et al. | | |
| 2008/0166978 A1* | 7/2008 | Cheah et al. | ..................... | 455/75 |

FOREIGN PATENT DOCUMENTS

| | | |
|---|---|---|
| CN | 1868115 A | 11/2006 |
| JP | 09-064649 | 3/1997 |
| JP | 2001-177425 | 6/2001 |

OTHER PUBLICATIONS

State Intellectual Property Office of P.R.C., First Notification of Rejection Reasons for Application No. 2009-10140245.5, Mail Date Jan. 26, 2011.

* cited by examiner

*Primary Examiner* — Christian Hannon
(74) *Attorney, Agent, or Firm* — SoCal IP Law Group LLP; Steven C. Sereboff; John E. Gunther (57) ABSTRACT

A receiving apparatus comprising: a first mixing unit to output first and second mixed signals each having a first frequency that is a frequency difference between a received signal and a first local oscillator signal, the first and second mixed signals having phases substantially orthogonal to each other; a phase control unit to output second and third local oscillator signals each having a second frequency, the second and third local oscillator signals having a phase difference from each other corresponding to a phase difference between the first and second mixed signals; and a second mixing unit to add a signal obtained by mixing the first mixed signal and the second local oscillator signal, and a signal obtained by mixing the second mixed signal and the third local oscillator signal, to output an intermediate frequency signal having an intermediate frequency that is a difference between the first and second frequencies.

4 Claims, 5 Drawing Sheets

RECEIVING APPARATUS

CROSS-REFERENCE TO RELATED APPLICATION

This application claims the benefit of priority to Japanese Patent Application No. 2008-181902, filed Jul. 11, 2008, of which full contents are incorporated herein by reference.

BACKGROUND OF THE INVENTION

1. Field of the Invention

The present invention relates to a receiving apparatus.

2. Description of the Related Art

Figure 6:
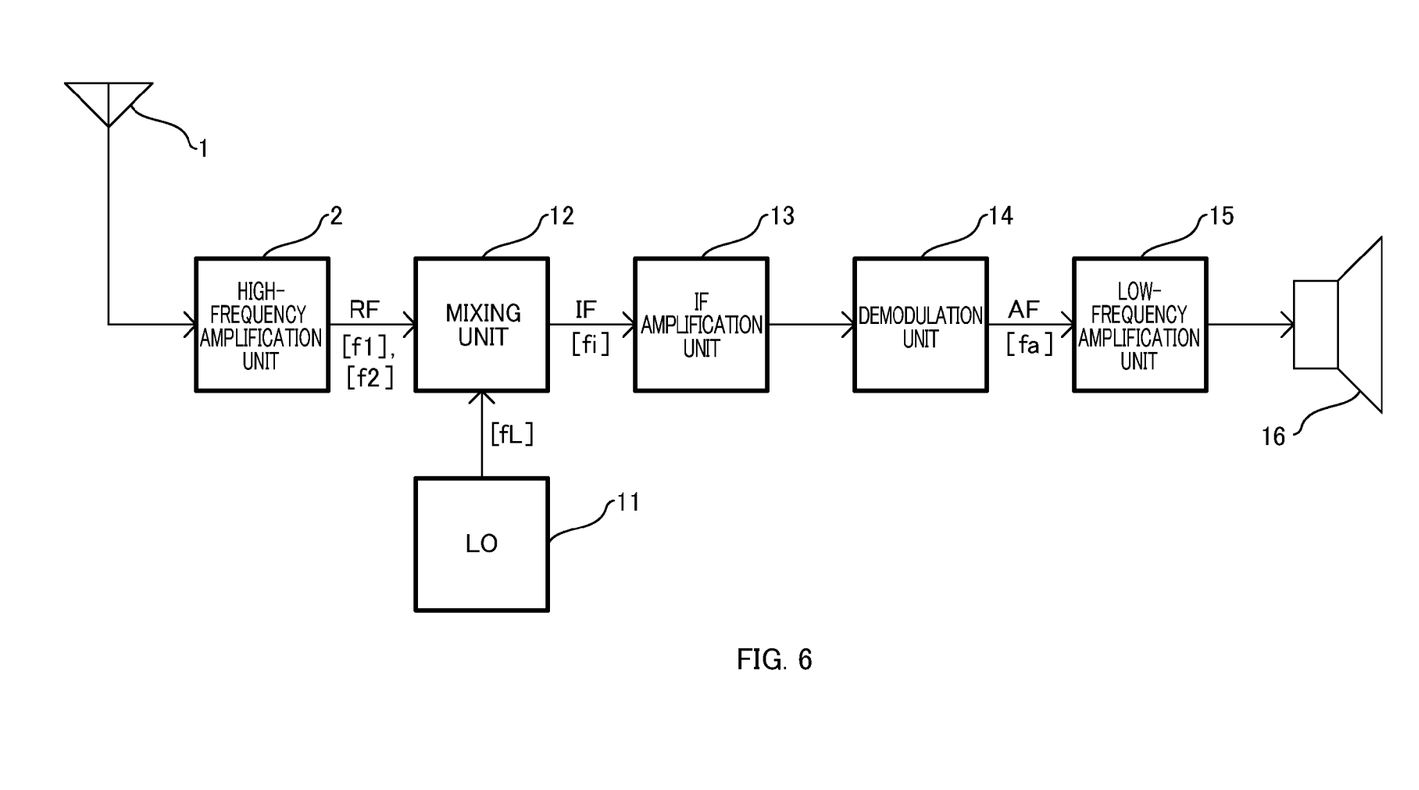
FIG. 6 is a block diagram illustrating an example of a configuration of a general super-heterodyne receiving apparatus.

As a receiving apparatus in radio communication, a super-heterodyne system including an LO (Local Oscillator) 11 and a mixing unit 12 is generally known, as shown in FIG. 6, for example. In the receiving apparatus of the super-heterodyne system, a high-frequency RF (Radio Frequency) signal is mixed in the mixing unit 12 with a local oscillator signal from the LO 11 to be converted into an IF (Intermediate Frequency) signal so that a circuit handling a high frequency is not needed at a subsequent stage.

Furthermore, in the super-heterodyne system, since an RF signal is received which is referred to as an image signal having a frequency f2 (=2fL−f1) symmetric with a frequency f1 of the RF signal which is desirable to be received around a frequency fL of the local oscillator signal, an image cancelling mixer circuit having a function to remove the image signal is generally known as the mixing unit 12. In FIG. 3 of Japanese Patent Laid-Open Publication No. 2001-177425, there is disclosed an image cancelling mixer circuit where input high frequency signals are respectively mixed with a pair of local oscillator signals which are orthogonal in phase to each other and a generated pair of mixed signals is used.

As described above, by removing the image signal causing interference in the super-heterodyne system, only the RF signal having a desired frequency can be received.

In the above image cancelling mixer circuit, there is a problem that phase shift or gain shift is caused by variation in components to be used or change in ambient temperature, and when the generated pair of mixed signals are not orthogonal in phase to each other or when the signals are different in amplitude, the image signal cannot be completely removed. Therefore, in the image cancelling mixer circuit disclosed in FIGS. 10, 13, 16, etc., in Japanese Patent Laid-Open Publication No. 2001-177425, the phase shift and the gain shift are corrected using an all-pass filter, a delay circuit, and a gain control circuit. However, in the correcting method, in order to reliably remove the image signal, it is required to grasp frequency characteristics, temperature characteristics, voltage characteristics, etc., of the all-pass filter or the like and to change a method of controlling the all-pass filter or the like according to each of the characteristics.

Therefore, a process is required in which the image cancelling mixer circuit is adjusted in advance in every receiving apparatus.

SUMMARY OF THE INVENTION

A receiving apparatus according to an aspect of the present invention, comprises: a first mixing unit configured to output first and second mixed signals each having a first frequency that is a frequency difference between a received signal and a first local oscillator signal, the first and second mixed signals having phases substantially orthogonal to each other; a phase control unit configured to output second and third local oscillator signals each having a second frequency, the second and third local oscillator signals having a phase difference from each other corresponding to a phase difference between the first and second mixed signals; and a second mixing unit configured to add a signal obtained by mixing the first mixed signal and the second local oscillator signal, and a signal obtained by mixing the second mixed signal and the third local oscillator signal, to output an intermediate frequency signal having an intermediate frequency that is a difference between the first frequency and the second frequency.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

<Configuration of Entire Receiving Apparatus>

Figure 1:
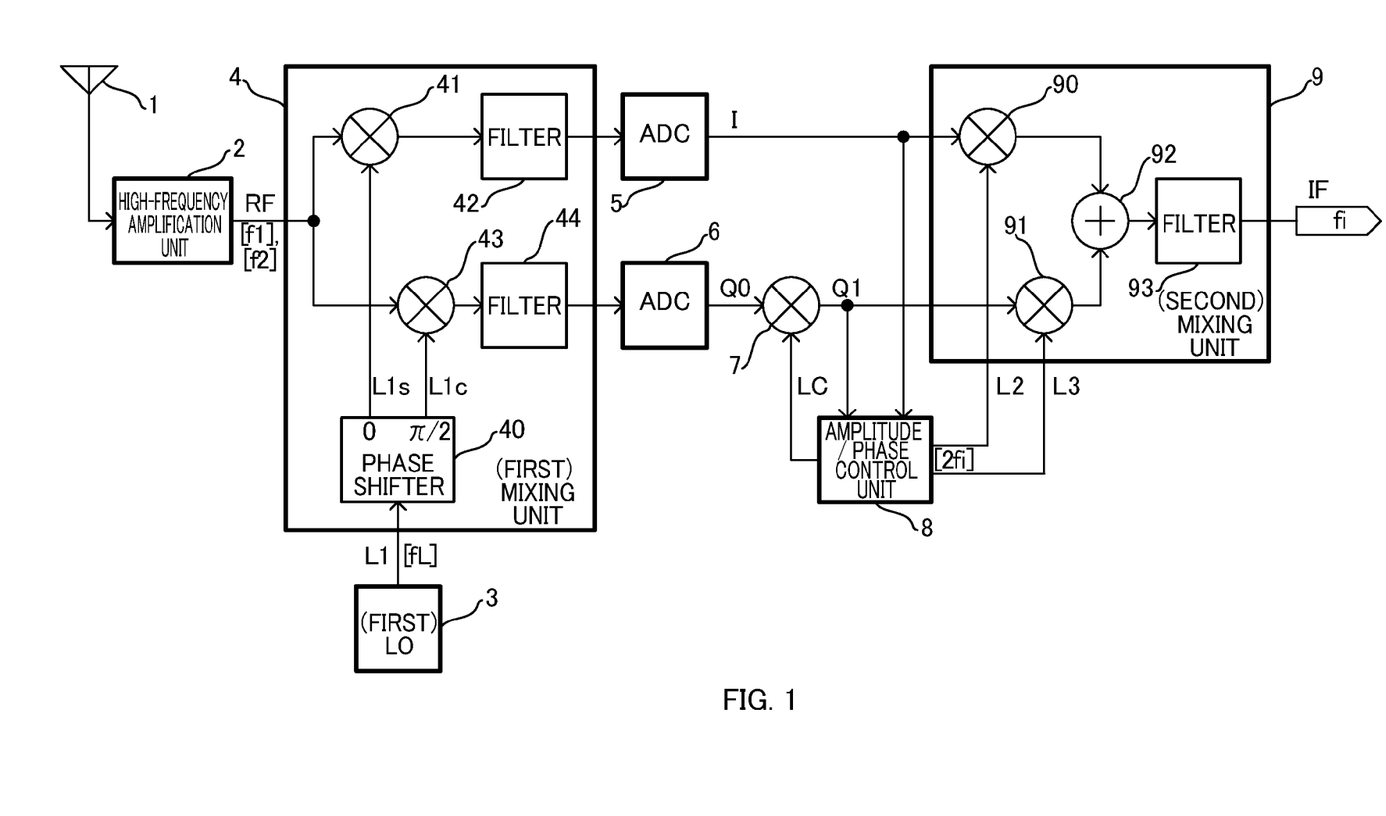
FIG. 1 is a block diagram illustrating a part of a configuration of a receiving apparatus according to an embodiment of the present invention.

A configuration of an entire receiving apparatus according to an embodiment of the present invention will be described below referring to FIG. 1. In FIG. 1, there will be omitted a configuration at output of an IF signal and thereafter, which is the same configuration as that of a general super-heterodyne receiving apparatus shown in FIG. 6.

The receiving apparatus shown in FIG. 1 includes an antenna 1, a high-frequency amplification unit 2, a first LO 3, a first mixing unit 4, ADCs (Analog-Digital Converters) 5 and 6, a multiplication unit 7, an amplitude/phase control unit 8, and a second mixing unit 9, and the receiving apparatus is used for receiving radio broadcasting, for example. The IF signal output from the mixing unit 9 is input to an IF amplification unit 13 similarly to the receiving apparatus shown in FIG. 6, and after the IF amplification unit 13, a demodulation unit 14, a low-frequency amplification unit 15, and a speaker 16, for example, are connected sequentially.

The mixing unit 4 includes a phase shifter 40, mixers 41 and 43, and filters 42 and 44, for example. An RF signal, which is a high-frequency received signal in the antenna 1, is input to the mixers 41 and 43 through the high-frequency amplification unit 2. A first local oscillator signal L1 output from the LO3 is input to the mixers 41 and 43 through the phase shifter 40. A first mixed signal output from the mixer 41 is output as an I signal through the filter 42, and a second mixed signal output from the mixer 43 is output as a Q0 signal through the filter 44 from the mixing unit 4, respectively.

The mixing unit 9 includes multiplication units 90 and 91, an addition unit 92, and a filter 93, for example. The I signal is input to the multiplication unit 90 through the ADC 5, and the Q0 signal is input to the multiplication unit 91 through the ADC 6 and the multiplication unit 7. An amplitude control signal LC, a second local oscillator signal L2, and a third local oscillator signal L3 output from the amplitude/phase control unit 8 are input to the multiplication units 7, 90, and 91, respectively. Output signals of the multiplication units 90 and 91 are both input to the addition unit 92, and an output signal of the addition unit 92 is output from the mixing unit 9 as the IF signal through the filter 93.

<Operation of the Entire Receiving Apparatus>

Figure 3:
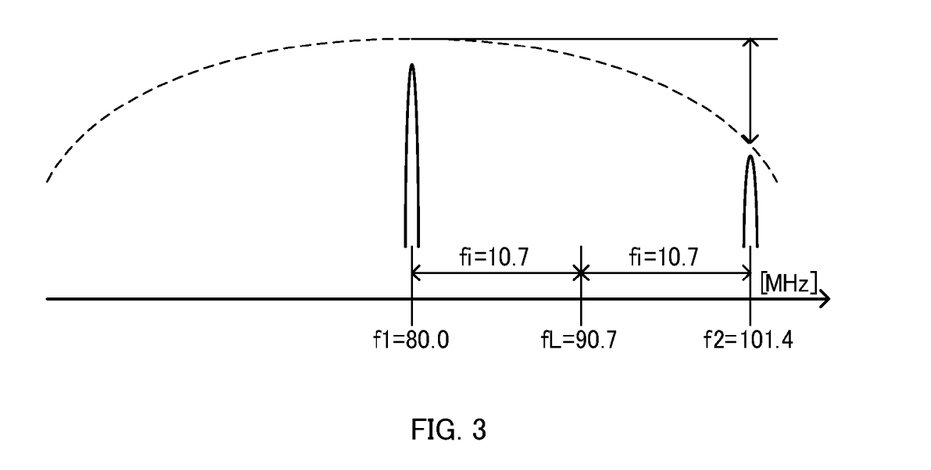
FIG. 3 is a schematic diagram illustrating an example of a relationship between frequencies and intermediate frequencies of a desired signal and an image signal in a general FM radio receiving apparatus.

First, there will be described an operation when the I signal and the Q0 signal are equal in amplitude and orthogonal in phase to each other. In this case, since no gain shift or phase shift is caused, there is unnecessary to perform correction by the multiplication unit 7 and the amplitude/phase control unit 8. Hereinafter, the RF signal desirable to be received will be referred to as a desired signal H1, and assuming that a frequency of the desired signal H1 is f1, a frequency of the local oscillator signal L1 is fL, and each frequency of the I signal and the Q0 signal is fi, which is the same as an intermediate frequency of the IF signal, there will be described a high-side heterodyne system where a relation is expressed by f1=fL−fi as shown in FIG. 3, for example, according to an embodiment of the present invention.

The high-frequency amplification unit 2 selectively amplifies a frequency band including the desired signal H1 to be input to the mixers 41 and 43 of the mixing unit 4. Here, supposing that the amplitude and angular frequency of the desired signal H1 are A and $\omega 1(=2\pi \times f1)$, respectively, the desired signal H1 can be expressed as follows:

$$H1 = A \cdot \sin(\omega 1 \cdot t)$$

The local oscillator signal L1 is input from the LO3 to the phase shifter 40 of the mixing unit 4, and the phase shifter 40 outputs a pair of L1s signal and L1c signal whose phases are orthogonal to each other, to be input to the mixers 41 and 43, respectively. Here, supposing that L1c signal advances in phase with respect to the L1s signal by $\pi/2$ and that the angular frequency of the local oscillator signal L1 is $\omega L$ ($=2\pi \times fL$), the L1s signal and the L1c signal can be expressed, respectively, as follows:

$$L1s = \sin(\omega L \cdot t)$$

$$L1c = \cos(\omega L \cdot t)$$

The mixer 41 inputs a first mixed signal obtained by mixing the desired signal H1 and the L1s signal to the filter 42, and the filter 42 configured as a LPF (Low-Pass Filter) or a BPF (Band-Pass Filter) shuts off a frequency component of the sum (fL+f1) included in the first mixed signal, and passes a frequency component of a difference (fL−f1=fi), to be output as the I signal. Therefore, supposing that each angular frequency of the I signal and the Q0 signal is $\omega i(=2\pi \times fi)$, the I signal output from the filter 42 is expressed as follows:

$$I = H1 \times L1s = (A/2) \cdot \cos(\omega i \cdot t)$$

Similarly, the Q0 signal output from the filter 44 configured as the LPF or BPF is expressed as follows:

$$Q0 = H1 \times L1c = -(A/2) \cdot \sin(\omega i \cdot t)$$

As mentioned above, the mixing unit 4 (first mixing unit) outputs the I signal and the Q0 signal (first and second mixed signals) each having a frequency difference fi (first frequency) between the desired signal H1 (received signal) and the local oscillator signal L1 (first local oscillator signal) and the I signal and the Q0 signal are orthogonal in phase to each other.

The I signal and Q0 signal output from the mixing unit 4 are respectively converted by the ADCs 5 and 6 into digital signals, and thereafter, the converted signals are subjected to digital signal processing by a digital circuit and digital signal processor and the like. The I signal having been converted into a digital signal is input to the multiplication unit 90 of the mixing unit 9, while the Q0 signal having been converted into a digital signal is made into a Q1 signal through the multiplication unit 7 and then input to the multiplication unit 91 of the mixing unit 9.

The amplitude/phase control unit 8 inputs an amplitude control signal LC to the multiplication unit 7 according to an amplitude difference between the I signal and the Q1 signal. When the I signal and the Q0 signal are equal in amplitude, such an amplitude control signal LC that a gain of the Q1 signal relative to the Q0 signal becomes a factor of one is input to the multiplication unit 7, and Q1=Q0 holds. Therefore, the I signal and the Q1 signal become equal in amplitude and the state becomes in a steady state. Also, the amplitude/phase control unit 8 inputs local oscillator signals L2 and L3 each having a frequency 2fi, which is twice the frequency of the I signal and the Q0 signal, into the multiplication units 90 and 91 of the mixing unit 9, respectively, according to a phase difference between the I signal and the Q1 signal. Here, if the I signal and the Q1 signal are orthogonal in phase to each other, the local oscillator signals L2 and L3 are orthogonal in phase to each other and can be expressed, respectively, as follows:

$$L2 = \sin(2\omega i \cdot t)$$

$$L3 = \cos(2\omega i \cdot t)$$

The multiplication unit 90 of the mixing unit 9 inputs to the addition unit 92 a signal obtained by mixing the I signal and the local oscillator signal L2, while the multiplication unit 91 inputs to the addition unit 92 a signal obtained by mixing the Q1 signal and the local oscillator signal L3 are mixed. The addition unit 92 inputs to the filter 93 a signal obtained by adding output signals of the multiplication units 90 and 91; and the filter 93 configured as the LPF or BPF shuts off a frequency component of the sum (2fi+fi=3fi) included in the output signal of the addition unit 92, and passes a frequency component of the difference (2fi−fi=fi). Therefore, the IF signal output from the filter 93 is expressed as follows:

$$\begin{aligned} IF &= I \times L2 + Q1 \times L3 \\ &= (A/2) \cdot [\sin(2\omega i \cdot t) \times \cos(\omega i \cdot t)] - \\ &\quad (A/2) \cdot [\cos(2\omega i \cdot t) \times \sin(\omega i \cdot t)] \\ &= (A/2) \cdot \sin(\omega i \cdot t) \end{aligned}$$

As mentioned above, the mixing unit 9 (second mixing unit) adds the signal obtained by mixing the I signal (first mixing signal) and the local oscillator signal L2 (second local oscillator signal); and the signal obtained by mixing the Q1 signal (second mixing signal) and the local oscillator signal L3 (third local oscillator signal), and outputs the IF signal having a frequency fi (intermediate frequency), which is a difference between the frequency fi (first frequency) of the I signal and the Q0 signal; and the frequency 2fi (second frequency) of the local oscillator signals L2 and L3. Also, the IF signal output from the mixing unit 9 is amplified by the IF amplification unit 13, and then converted into a low-frequency AF (Audio Frequency) at the demodulation unit 14. The AF signal is amplified by the low-frequency amplification unit 15, and then output as sound from the speaker 16.

Although the actual RF signal input to the mixing unit 4 includes a frequency component around the desired signal H1 according to the frequency characteristic of the antenna 1 and the high-frequency amplification unit 2, information included in the desired signal H1 having the frequency f1(=fL−fi) can be selectively converted into the AF signal, by tuning the IF amplification unit 13 and the demodulation unit 14 to the intermediate frequency fi of the IF signal. However, if the component of the frequency f2 (=fL+fi) is included in the RF signal, the frequency f2 can also generate the intermediate frequency fi by the frequency fL of the local oscillator signal L1, which may cause interference.

Hereinafter, the RF signal having the frequency f2 is referred to as an image signal H2, and supposing that the amplitude and the angular frequency of the image signal H2 are B and ω2 (=2π×f2), respectively, the image signal H2 can be expressed as follows:

$$H2 = B \cdot \sin(\omega 2 \cdot t)$$

Therefore, when calculated as in the case of the desired signal H1, the I signal and the Q1 signal relative to the image signal H2 can be expressed, respectively, as follows:

$$I = H2 \times L1s = (B/2) \cdot \cos(\omega i \cdot t)$$

$$Q1 = Q0 = H2 \times L1c = (B/2) \cdot \sin(\omega i \cdot t)$$

Furthermore, since the filter 93 configured as the LPF or BPF shuts off the frequency component of the sum included in the output signal of the addition unit 92, as mentioned above, the IF signal relative to the image signal H2 can be expressed as follows:

$$\begin{aligned} IF &= I \times L2 + Q1 \times L3 \\ &= (B/2) \cdot [\sin(2\omega i \cdot t) \times \cos(\omega i \cdot t)] + \\ &\quad (B/2) \cdot [\cos(2\omega i \cdot t) \times \sin(\omega i \cdot t)] \\ &= (B/2) \cdot \sin(3\omega i \cdot t) \\ &= 0 \end{aligned}$$

Therefore, the image signal H2 is removed.

As mentioned above, if the I signal and the Q0 signal are equal in amplitude and orthogonal in phase to each other, the desired signal H1 in the RF signal input to the mixing unit 4 is converted into the IF signal having the intermediate frequency fi, however, the image signal H2 is removed, and thus, interference can be prevented.

An influence of the gain shift and the phase shift on removal of the image signal H2 will be described.

If the L1c signal advances in phase with respect to the L1s signal by π/2+θ(|θ|<<0.5), for example, the L1s signal and the L1c signal can be expressed as follows:

$$L1s = \sin(\omega L \cdot t)$$

$$L1c = \cos(\omega L \cdot t + \theta)$$

If the gain of the filter 44 is p times (p≈1) the gain of the filter 42, for example, the I signal and the Q1 signal relative to the image signal H2 can be expressed, respectively, as follows:

$$I = H2 \times L1s = (B/2) \cdot \cos(\omega i \cdot t)$$

$$Q1 = Q0 = p \times H2 \times L1c = (B/2) \cdot p \cdot \sin(\omega i \cdot t - \theta)$$

The amplitude of the Q1 signal is p times the amplitude of the I signal, and the phase of the Q1 signal is delayed by π/2+θ with respect to the I signal. Therefore, the IF signal relative to the image signal H2 can be expressed as follows:

$$\begin{aligned} IF &= I \times L2 + Q1 \times L3 \\ &= (B/2) \cdot [\sin(2\omega i \cdot t) \times \cos(\omega i \cdot t)] + \\ &\quad (B/2) \cdot p \cdot [\cos(2\omega i \cdot t) \times \sin(\omega i \cdot t - \theta)] \\ &= (B/4) \cdot \sin(\omega i \cdot t) - (B/4) \cdot p \cdot \sin(\omega i \cdot t + \theta) \\ &= (B/4) \cdot (1 - p \cdot \cos\theta) \cdot \sin(\omega i \cdot t) - \\ &\quad (B/4) \cdot (p \cdot \sin\theta) \cdot \cos(\omega i \cdot t) \end{aligned}$$

Supposing that θ=2π/360 (=1°), p=0.98 (≈−0.2 dB) as an example, the IF signal can be expressed as follows:

$$\begin{aligned} IF &\approx (B/200) \cdot [\sin(\omega i \cdot t) - \cos(\omega i \cdot t)] \\ &\approx (B/140) \cdot \sin(\omega i \cdot t - \pi/4) \end{aligned}$$

In this case, if an amplitude A of the desired signal H1 is equal to an amplitude B of the image signal H2, the amplitude of the IF signal relative to that of the image signal H2 becomes about 1/70 (≈−37 dB) of the case of the desired signal H1. Moreover, as shown in FIG. 3, for example, in a general FM radio receiving apparatus using the intermediate frequency fi of 10.7 MHz, the antenna 1 and the high-frequency amplification unit 2 attenuates the image signal H2 which lies outside the FM radio band, and then inputs the attenuated image signal to the mixing unit 4, and thus, interference caused by the image signal H2 can be suppressed to some degrees.

Figure 4:
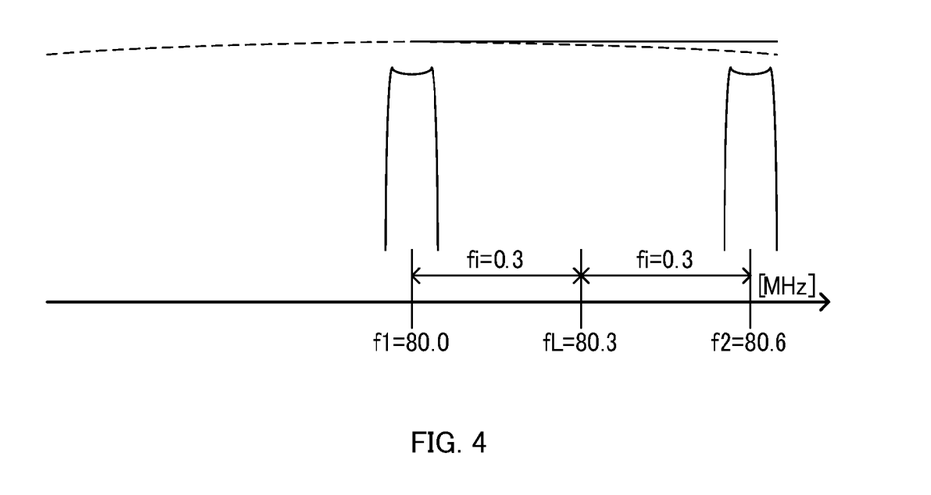
FIG. 4 is a schematic diagram illustrating an example of a relationship between frequencies and intermediate frequencies of a desired signal and an image signal in a low-IF method FM radio receiving apparatus.

However, if the amplitude B of the image signal H2 is far greater than the amplitude A of the desired signal H1 and the amplitude of the IF signal relative to that of the image signal H2 becomes greater than the amplitude of the IF signal relative to that of the desired signal H1, interference can occur. Also, as shown in FIG. 4, for example, in the FM radio receiving apparatus of the low IF method using the intermediate frequency fi of about several hundred kHz, the frequency f2 of the image signal H2 falls within the FM radio band, and it is difficult for the antenna 1 and the high-frequency amplification unit 2 to attenuate the image signal H2. Therefore, in this case as well, the gain shift and the phase shift are required to be prevented or corrected in order to remove the image signal H2 with reliability. There will hereinafter be described an operation to correct the gain shift and the phase shift and to remove the image signal.

As mentioned above, the amplitude/phase control unit 8 inputs the amplitude control signal LC to the multiplication unit 7 according to the amplitude difference between the I signal and the Q1 signal. Here, if the amplitude of the Q0 signal is p times the amplitude of the I signal, such a digital signal that the gain of the Q1 signal relative to the Q0 signal is 1/p times, for example, is input to the multiplication unit 7 as the amplitude control signal LC, and the I signal and the Q1 signal relative to the image signal H2 can be expressed, respectively, as follows:

$$I = H2 \times L1s = (B/2) \cdot \cos(\omega i \cdot t)$$

$$Q1 = (1/p) \times Q0 = H2 \times L1c = (B/2) \cdot \sin(\omega i \cdot t - \theta)$$

Therefore, the I signal and the Q1 signal become equal in amplitude and become in a steady state. Also, as mentioned above, the amplitude/phase control unit 8 inputs the local oscillator signals L2 and L3 to the multiplication units 90 and 91, respectively, according to the phase difference between the I signal and the Q1 signal. Here, if the Q1 signal advances in phase by $\pi/2 + \theta$ with respect to the I signal, the local oscillator signal L3 which advances in phase by $\pi/2 - \theta$ with respect to the local oscillator signal L2 is input, for example, and the local oscillator signals L2 and L3 can be expressed, respectively, as follows:

$$L2 = \sin(2\omega i \cdot t)$$

$$L3 = \cos(2\omega i \cdot t - \theta)$$

Therefore, the IF signal relative to the image signal H2 can be expressed as follows:

$$\begin{aligned}
IF &= I \times L2 + Q1 \times L3 \\
&= (B/2) \cdot [\sin(2\omega i \cdot t) \times \cos(\omega i \cdot t)] + \\
&\quad (B/2) \cdot [\cos(2\omega i \cdot t - \theta) \times \sin(\omega i \cdot t - \theta)] \\
&= (B/4) \cdot \sin(3\omega i \cdot t) + (B/4) \cdot \sin(3\omega i \cdot t - 2\theta) \\
&= 0
\end{aligned}$$

Therefore, the image signal H2 is removed. On the other hand, when calculated similarly as to the desired signal H1, the IF signal relative to the desired signal H1 becomes as follows:

$$\begin{aligned}
IF &= I \times L2 + Q1 \times L3 \\
&= (A/2) \cdot [\sin(2\omega i \cdot t) \times \cos(\omega i \cdot t)] - \\
&\quad (A/2) \cdot [\cos(2\omega i \cdot t - \theta) \times \sin(\omega i \cdot t + \theta)] \\
&= (A/4) \cdot \sin(\omega i \cdot t) + (A/4) \cdot \sin(\omega i \cdot t - 2\theta) \\
&= (A/4) \cdot (1 + \cos 2\theta) \cdot \sin(\omega i \cdot t) - \\
&\quad (A/4) \cdot \sin 2\theta \cdot \cos(\omega i \cdot t)
\end{aligned}$$

Here, since $|2\theta| \ll 1$ $$IF \approx (A/2) \cdot \sin(\omega i \cdot t)$$

Therefore, the desired signal H1 is converted into the IF signal substantially the same as in the case where the I signal and the Q0 signal are equal in amplitude and orthogonal in phase to each other.

As mentioned above, since the amplitude/phase control unit 8 outputs the amplitude control signal LC and the local oscillator signals L2 and L3 and corrects the gain shift and the phase shift, the desired signal H1 in the RF signal is converted into the IF signal having the intermediate frequency fi, but the image signal H2 is removed, and thus, interference can be prevented.

<Configuration and Operation of the Amplitude Control Unit>

As mentioned above, if a gain shift occurs and the I signal and the Q0 signal are different in amplitude, the amplitude/phase control unit 8 inputs the amplitude control signal LC to the multiplication unit 7 according to the amplitude difference between the I signal and the Q1 signal so as to correct the gain shift. Hereinafter a unit to output the amplitude control signal LC in the amplitude/phase control unit 8 and the multiplication unit 7 are collectively referred to as an amplitude control unit, and a configuration of the amplitude control unit according to an embodiment of the present invention will be described referring to FIG. 2. The amplitude control unit for correcting the gain shift includes the multiplication unit 7 and an amplitude correction unit 80 of the amplitude/phase control unit 8, which are surrounded by long broken lines in FIG. 2 according to an embodiment of the present invention.

Figure 2:
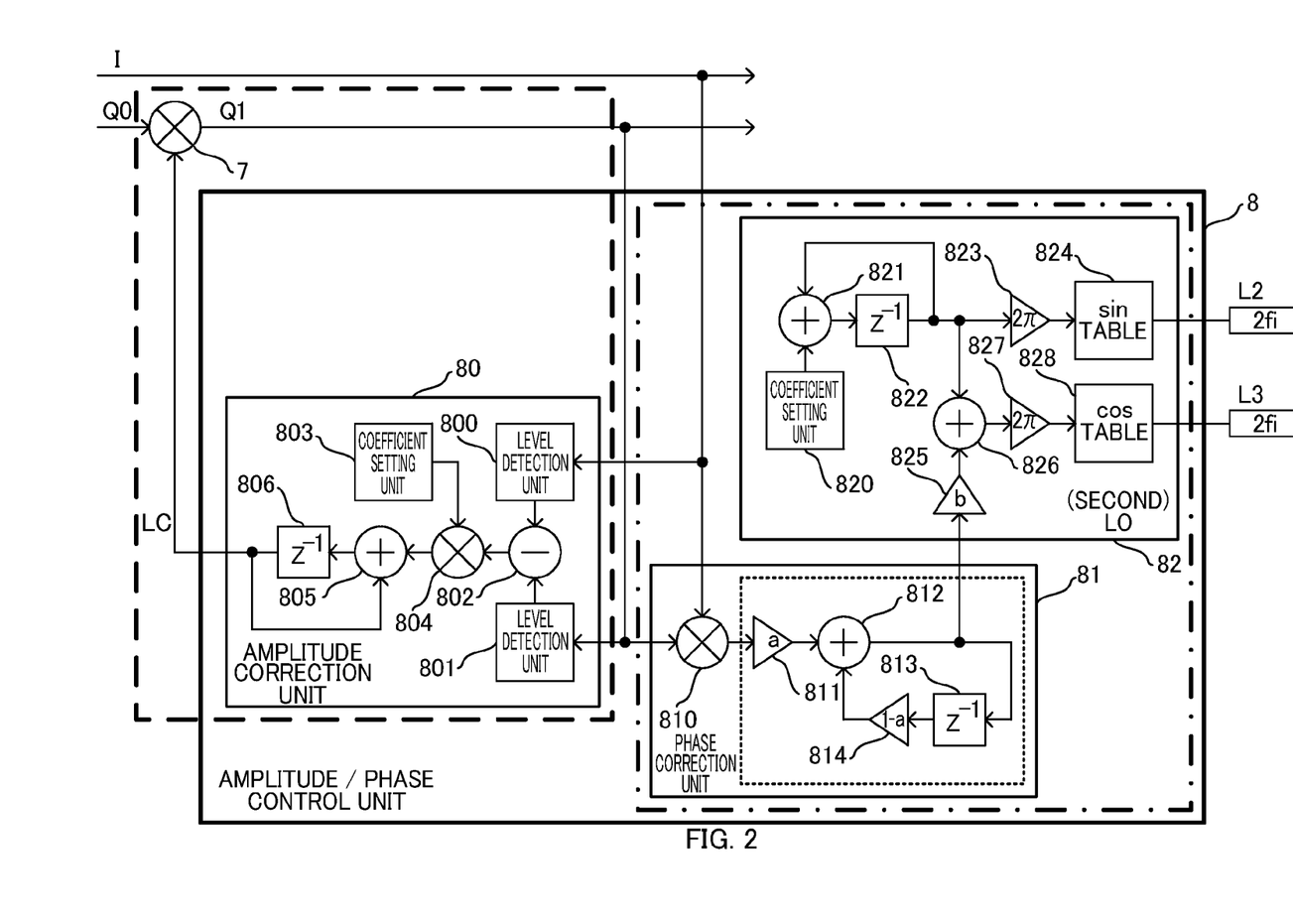
FIG. 2 is a block diagram illustrating configurations of an amplitude control unit and a phase control unit according to an embodiment of the present invention.

The amplitude correction unit 80 includes level detection units 800 and 801, a subtraction unit 802, a coefficient setting unit 803, a multiplication unit 804, an addition unit 805, and a delay unit 806, for example, according to an embodiment of the present invention. The I signal and the Q1 signal are input to the level detection units 800 and 801, respectively, and the output values of the level detection units 800 and 801 are both input to the subtraction unit 802. The output value of the subtraction unit 802 is input to the multiplication unit 804 together with the output value of the coefficient setting unit 803, and the output value of the multiplication unit 804 is input to the addition unit 805. The output value of the addition unit 805 is input to the delay unit 806, and the output value of the delay unit 806 is input to the multiplication unit 7 as the amplitude control signal LC and concurrently fed back to the addition unit 805.

There will be described an operation of the amplitude control unit according to an embodiment of the present invention.

The level detection unit 800 of the amplitude correction unit 80 detects a maximum value and a minimum value in 1 cycle (=1/fi) of the input I signal and outputs a difference between the maximum value and the minimum value corresponding to twice the amplitude of the I signal, for example. Similarly, the level detection unit 801 outputs a difference between a maximum value and a minimum value in 1 cycle of the Q1 signal. The subtraction unit 802 outputs a difference between the output values of the level detection units 800 and 801, and the multiplication unit 804 outputs a value obtained by multiplying the output value of the subtraction unit 802 by a predetermined coefficient set in the coefficient setting unit 803. Here, supposing that the output values of the level detecting units 800 and 801 are Li and Lq, respectively, and a coefficient set in the coefficient setting unit 803 is k, when the subtraction unit 802 outputs Li−Lq, k>0 holds, and when the subtraction unit 802 outputs Lq−Li, k<0 holds. The addition unit 805 sequentially adds the output value of the multiplication unit 804 to the output value of the addition unit 805 itself, which is fed back through the delay unit 806; to increase a value of the amplitude control signal LC output from the delay unit 806 while Lq<Li holds, and to decrease the value of the amplitude control signal LC while Lq>Li holds; so that an amplitude of the Q1 signal obtained by multiplying the Q0 signal and the amplitude control signal LC becomes equal to the amplitude of the I signal. Therefore, as mentioned above, when the amplitude of the Q0 signal is p times the amplitude of the I signal, in a state where such an amplitude control signal LC that the gain of the Q1 signal relative to the Q0 signal becomes 1/p times is input to the multiplication unit 7, Lq=Li holds, and thus, the output value of the subtraction unit 802 becomes 0. Therefore, the value of the amplitude control signal LC is kept constant and the state becomes in a steady state. If |k| is set great, the amplitude control signal LC is rapidly changed in value, and if |k| is set small, the amplitude control signal LC is slowly changed in value.

As mentioned above, the amplitude control unit controls the Q1 signal in amplitude with the amplitude control signal LC having a voltage corresponding to the amplitude difference between the I signal and the Q1 signal (first and second mixed signals).

<Configuration and Operation of the Phase Control Unit>

As mentioned above, if the phase shift occurs and the I signal and the Q0 signal are not orthogonal in phase to each other, the amplitude/phase control unit 8 inputs the local oscillator signals L2 and L3 to the multiplication units 90 and 91, respectively, according to a phase difference between the I signal and the Q1 signal so as to correct the phase shift. Hereinafter a unit to output the local oscillator signals L2 and L3 in the amplitude/phase control unit 8 is referred to as a phase control unit, and there will be described a configuration of the phase control unit according to an embodiment of the present invention referring to FIG. 2. The phase control unit for correcting the phase shift includes a phase correction unit 81 of the amplitude/phase control unit 8 and a second LO 82 surrounded by alternate long and short dashed lines in FIG. 2 according to an embodiment of the present invention.

The phase correction unit 81 includes a multiplication unit 810, amplification units 811 and 814, an addition unit 812, and a delay unit 813, for example, according to an embodiment of the present invention. The I signal and the Q1 signal are both input to the multiplication unit 810, and the output value of the multiplication unit 810 is input to the addition unit 812 through the amplification unit 811. The output value of the addition unit 812 is input to the LO 82 as an output value of the phase correction unit 81 and concurrently fed back to the addition unit 812 through the delay unit 813 and the amplification unit 814.

The LO 82 includes: a coefficient setting unit 820; addition units 821 and 826; a delay unit 822; amplification units 823, 825, and 827; a sine table 824; and a cosine table 828, for example, according to an embodiment of the present invention. The output value of the coefficient setting unit 820 is input to the addition unit 821, and the output value of the addition unit 821 is input to the delay unit 822. The output value of the delay unit 822 is input to the sine table 824 through the amplification unit 823 and concurrently fed back to the addition unit 821. Moreover, the output value of the delay unit 822 is input to the addition unit 826 together with the output value of the phase correction unit 81 which is input through the amplification unit 825. The output value of the addition unit 826 is input to the cosine table 828 through the amplification unit 827. The output values of the sine table 824 and the cosine table 828 are input to the mixing unit 9 as the local oscillator signals L2 and L3, respectively.

There will be described an operation of the phase control unit according to an embodiment of the present invention.

The multiplication unit 810 of the phase correction unit 81 outputs a value obtained by multiplying the input I signal and the Q1 signal. The addition unit 812 sequentially adds the output value of the multiplication unit 810, which is input through the amplification unit 811, to the output value of the addition unit 812 itself, which is fed back through the delay unit 813, to be input to the LO 82. Here, supposing that the gains of the amplification units 811 and 814 are a and 1−a, respectively, for example, the amplification units 811 and 814, the addition unit 812, and the delay unit 813, as a whole, which are surrounded by short broken lines in FIG. 2, serve as a primary integral (low-pass) filter where the output value of the multiplication unit 810 is integrated with a gain of 1. Therefore, when the phase difference between the I signal and the Q1 signal is π/2+θ, supposing that the I signal and the Q1 signal whose gain shifts are corrected by the amplitude control unit are expressed, respectively, as follows:

$$I = (Li/2) \cdot \cos(\omega i \cdot t)$$

$$Q1 = (Li/2) \cdot \cos[\omega i \cdot t \pm (\pi/2 + \theta)]$$

the output value of the phase correction unit 81 can be expressed as follows:

$$I \times Q1 = (Li^2/8) \cdot \cos[\pm(\pi/2 + \theta)] - $$
$$= -(Li^2/8) \cdot \sin\theta$$

Here, since |θ|<<0.5 holds, it results in as follows:

$$I \times Q1 \approx -(Li^2/8) \cdot \theta$$

Therefore, the output value of the phase correction unit 81 is substantially in proportion to the phase shift θ from the phase difference π/2 between the I signal and the Q1 signal and is of opposite sign.

The addition unit 821 of the LO 82 sequentially adds a predetermined coefficient, which is set in the coefficient setting unit 820, to the output value of the addition unit 821 itself, which is fed back through the delay unit 822, to gradually increase the output value of the delay unit 822. The coefficient set in the coefficient setting unit 820 is expressed by a ratio of the frequency 2fi of each of the local oscillator signals L2 and L3 to a sampling frequency in the LO 82. Therefore, the sine table 824 converts the output value of the delay unit 822, which is input through the amplification unit 823 having a gain of 2π, into a sine wave, to be output as the local oscillator signal L2 having the frequency 2fi. The addition unit 826 outputs a value obtained by adding the output value of the phase correction unit 81, which is input through the amplification unit 825, to the output value of the delay unit 822. Therefore, the cosine table 828 coverts the output value of the addition unit 826, which is input through the amplification unit 827 having a gain of 2π, into a cosine wave, to be output as the local oscillator signal L3 having the frequency 2fi. Here, supposing that the gain of the amplification unit 825 is $8/Li^2$, for example, the output value of the amplification unit 825 is expressed as follows:

$$I \times Q1 \times (8/Li^2) = -\theta$$

Therefore, the local oscillator signal L3 advances in phase by π/2−θ with respect to the local oscillator signal L2, and thus, the local oscillator signals L2 and L3 can be expressed, respectively, as follows:

$$L2 = \sin(2\omega i \cdot t)$$

$$L3 = \cos(2\omega i \cdot t - \theta)$$

As mentioned above, the phase control unit outputs the local oscillator signals L2 and L3 (second and third local oscillator signals) each having the frequency 2fi (second frequency) and the phase difference π/2−θ obtained by subtracting the phase difference π/2 +θ between the I signal and the Q1 signal (first and second mixing signals) from π(=180°).

As mentioned above, in the receiving apparatus partially illustrated in FIGS. 1 and 2, the local oscillator signals L2 and L3 having the phase difference from each other corresponding to the phase difference between the I signal and the Q1 signal are output from the phase control unit, the signal obtained by mixing the I signal and the local oscillator signal L2; and the signal obtained by mixing the Q1 signal and the local oscillator signal L3 are added, and the IF signal having the intermediate frequency fi is output from the mixing unit 9. Thus, the phase shift is corrected, and interference caused by the image signal H2 is suppressed, and consequently, the desired signal H1 can be received.

Moreover, in the amplitude control unit, the Q1 signal is controlled in amplitude with the amplitude control signal LC according to the amplitude difference between the I signal and the Q signal, so that the gain shift is further corrected, and interference caused by the image signal H2 is prevented, and thus, the desired signal H1 can be received.

Furthermore, the I signal and the Q0 signal are converted into digital signals, so that digital signal processing is carried out in the amplitude control unit, the phase control unit, and the mixing unit 9, and thus, the gain shift and the phase shift can be corrected with high precision and the image signal H2 can be removed with reliability.

Furthermore, the phase difference between the local oscillator signals L2 and L3 is set at a value obtained by subtracting the phase difference between the I signal and the Q1 signal from 180°, and thus, the phase shift can be corrected with almost no change of the desired signal H1 and the image signal H2 can be removed with reliability.

In an embodiment as described above as shown in FIGS. 3 and 4, there is employed a high-side heterodyne receiving apparatus in which the frequency fL of the local oscillator signal L1 is higher than the frequency f1 of the desired signal H1, however, this is not limitative. In the case of a low-side heterodyne receiving apparatus in which the frequency fL is lower than the frequency f1 as well, the gain shift and the phase shift can be corrected similarly, and the image signal H2 can be removed.

Figure 5:
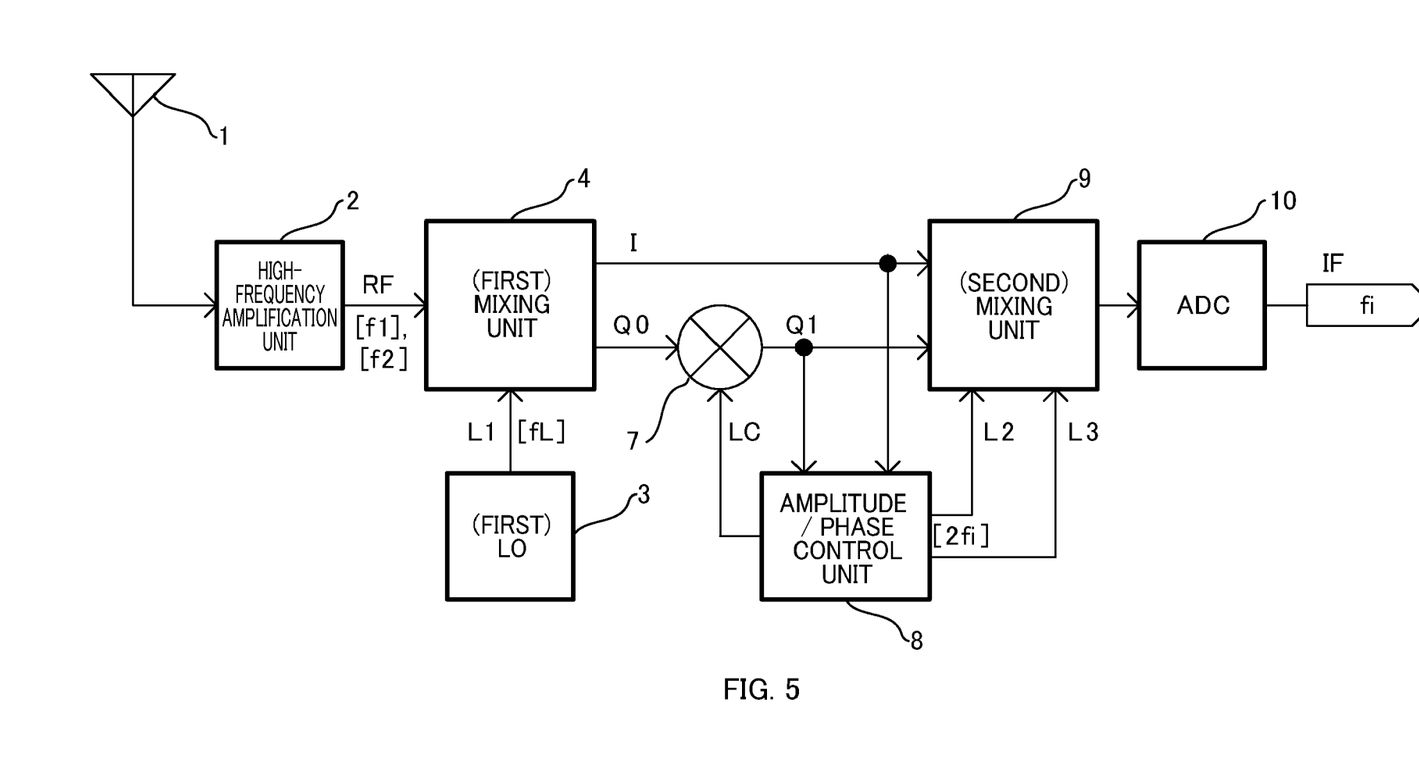
FIG. 5 is a block diagram illustrating a part of another configuration example of a receiving apparatus according to the present invention.

In an embodiment as described above as shown in FIG. 1, the I signal and the Q0 signal output from the mixing unit 4 are converted into digital signals by the ADC 5 and 6, respectively, and thereafter, digital signal processing is performed therefor, however, this is not limitative. As shown in FIG. 5, for example, a configuration may be made such that the IF signal output from the mixing unit 9 is converted into a digital signal by the ADC 10, and thereafter, the digital signal processing is performed therefore. A configuration as illustrated in FIG. 1 has such advantages that the digital signal processing is performed in the amplitude control unit, the phase control unit, and the mixing unit 9 so that the gain shift and the phase shift can be corrected with high precision, or the like. A configuration as illustrated in FIG. 5 has such advantages that a single ADC to be used is enough, or the like, from a viewpoint of current consumption.

In an embodiment as described above, the I signal converted into a digital signal by the ADC 5 is directly input to the multiplication unit 90 of the mixing unit 9, and the Q0 signal converted into a digital signal by the ADC 6 is directly input to the multiplication unit 7, however, this is not limitative. In an embodiment as described above, supposing that the RF signal having the frequency f3 (=fL−3fi) is referred to as a second image signal H3, an amplitude and an angular frequency of the second image signal H3 are C and $\omega 3$ ($=2\pi \times f3$), respectively, calculations are performed as in the case of the desired signal H1, they are expressed as follows:

$$H3 = C \cdot \sin(\omega 3 \cdot t)$$

$$I = H3 \times L1s = (C/2) \cdot \cos(\omega 3i \cdot t)$$

$$Q1 = Q0 = H3 \times L1c = -(C/2) \cdot \sin(3\omega i \cdot t)$$

$$IF = I \times L2 + Q1 \times L3$$
$$= (C/2) \cdot [\cos(\omega 3i \cdot t) \times \sin(2\omega i \cdot t)] -$$
$$(C/2) \cdot [\sin(3\omega i \cdot t) \times \cos(2\omega i \cdot t)] -$$
$$= -(C/2) \cdot \sin(\omega i \cdot t)$$

Therefore, the second image signal H3 is not removed by the mixing unit 9, to be mixed in the IF signal. Thus, a filter similar to the filter 93 for shutting off the frequency component of 3fi is preferably inserted in subsequent stages of the ADCs 5 and 6, so as to remove the second image signal H3, as well. A configuration may be made such that the frequency component of 3fi is shut off by the filters 42 and 44 in the mixing unit 4.

In an embodiment as described above, the frequency of each of the I signal and the Q0 signal is the same frequency as the intermediate frequency fi, however, this is not limitative. The frequencies of the I signal and the Q0 signal can be changed by changing the frequency fL of the local oscillator signal L1 under the condition that the frequency difference between the local oscillator signals L2 and L3 is the intermediate frequency fi. In this case, when the frequency fL is set such that the frequencies of the I signal and the Q0 signal become high, the frequency difference between the desired signal H1 and the image signal H2 becomes large, and thus, the image signal H2 can be input to the mixing unit 4 after being greatly attenuated by the antenna 1 and the high-frequency amplification unit 2. When the frequency fL is set such that the frequencies of the I signal and the Q0 signal become low, the frequency difference is constant between the frequency component of the sum and the frequency component of the difference included in the output signal of the addition unit 92, and the frequency component of the sum becomes easily shut off by the filter 93. Moreover, when the frequency fL is set such that the frequencies of the I signal and the Q0 signal become low, there can be suppressed current consumption due to analog/digital conversion in the ADCs 5 and 6 and digital signal processing thereafter. When the I signal and the Q0 signal get close to a direct current, an influence of a flicker noise (1/f noise) can be a problem, and thus, the frequency of each of the I signal and the Q0 signal is preferably a corner frequency or more.

The above embodiments of the present invention are simply for facilitating the understanding of the present invention and are not in any way to be construed as limiting the present invention. The present invention may variously be changed or altered without departing from its spirit and encompass equivalents thereof.

What is claimed is:

1. A receiving apparatus comprising:
a first mixing unit configured to output first and second mixed signals each having a first frequency that is a frequency difference between a received signal and a first local oscillator signal, a first phase difference between the first and second mixed signals being substantially 90 degrees;
a phase control unit configured to output second and third local oscillator signals each having a second frequency, the second and third local oscillator signals having a second phase difference from each other corresponding to the first phase difference between the first and second mixed signals; and
a second mixing unit configured to add a signal obtained by mixing the first mixed signal and the second local oscillator signal, and a signal obtained by mixing the second mixed signal and the third local oscillator signal, to output an intermediate frequency signal having an intermediate frequency that is a difference between the first frequency and the second frequency,
the phase control unit including
a phase correction unit configured to output a value substantially in proportion to a phase shift of the first phase difference with respect to 90 degrees, and
a local oscillator configured to output the second and third local oscillator signals having the second phase difference obtained by subtracting the first phase difference from 180 degrees, based on the value output from the phase correction unit.

2. The receiving apparatus according to claim 1, further comprising an amplitude control unit configured to control the second mixed signal in amplitude with an amplitude control signal having a voltage corresponding to an amplitude difference between the first and second mixed signals.

3. The receiving apparatus according to claim 1, wherein the first and second mixed signals are digital signals.

4. The receiving apparatus according to claim 2, wherein the first and second mixed signals are digital signals.

* * * * *